(12) United States Patent
Edwards et al.

(10) Patent No.: US 9,006,833 B2
(45) Date of Patent: Apr. 14, 2015

(54) BIPOLAR TRANSISTOR HAVING SINKER DIFFUSION UNDER A TRENCH

(71) Applicant: Texas Instruments Incorporated, Dallas, TX (US)

(72) Inventors: Henry Litzmann Edwards, Garland, TX (US); Akram A. Salman, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 146 days.

(21) Appl. No.: 13/933,910

(22) Filed: Jul. 2, 2013

(65) Prior Publication Data
US 2015/0008561 A1  Jan. 8, 2015

(51) Int. Cl.
*H01L 29/732* (2006.01)
*H01L 27/02* (2006.01)

(52) U.S. Cl.
CPC ........ *H01L 29/7322* (2013.01); *H01L 27/0248* (2013.01); *H01L 29/732* (2013.01)

(58) Field of Classification Search
CPC ................ H01L 23/60; H01L 27/0248; H01L 29/66234; H01L 29/66272; H01L 29/66295; H01L 29/6631; H01L 29/66196; H01L 29/732; H01L 29/7322; H01L 29/7325; H01L 29/7327
USPC ........................... 257/565, 586, 361, E27.055
See application file for complete search history.

(56) References Cited

U.S. PATENT DOCUMENTS

| | | | | |
|---|---|---|---|---|
| 4,494,134 A | * | 1/1985 | Wildi et al. | 257/273 |
| 4,929,996 A | | 5/1990 | Hutter | |
| 5,747,834 A | * | 5/1998 | Chen et al. | 257/111 |
| 5,850,095 A | * | 12/1998 | Chen et al. | 257/361 |
| 2012/0133024 A1 | * | 5/2012 | Prechtl et al. | 257/557 |

* cited by examiner

*Primary Examiner* — Daniel Luke
*Assistant Examiner* — Pavel Ivanov
(74) *Attorney, Agent, or Firm* — Jacqueline J. Garner; Frank Cimino

(57) ABSTRACT

A bipolar transistor includes a substrate having a semiconductor surface, a first trench enclosure and a second trench enclosure outside the first trench enclosure both at least lined with a dielectric extending downward from the semiconductor surface to a trench depth, where the first trench enclosure defines an inner enclosed area. A base and an emitter formed in the base are within the inner enclosed area. A buried layer is below the trench depth including under the base. A sinker diffusion includes a first portion between the first and second trench enclosures extending from a topside of the semiconductor surface to the buried layer and a second portion within the inner enclosed area, wherein the second portion does not extend to the topside of the semiconductor surface.

12 Claims, 4 Drawing Sheets

US 9,006,833 B2

BIPOLAR TRANSISTOR HAVING SINKER DIFFUSION UNDER A TRENCH

FIELD

Disclosed embodiments relate to bipolar junction transistors having at least one trench and integrated circuits having such bipolar transistors.

BACKGROUND

Bipolar junction transistors are active semiconductor devices formed by a pair of P-N junctions, including an emitter-base junction and a collector-base junction. An NPN bipolar junction transistor has a thin region of P-type material providing the base region between two regions of N-type material providing the emitter and collector regions. A PNP bipolar junction transistor has a thin region of N-type material providing the base region between two regions of P-type material constituting the emitter and collector regions. The movement of electrical charge carriers which produces electrical current flow between the collector region and the emitter region is controlled by an applied voltage across the emitter-base junction.

Conventional vertical NPN bipolar devices used for electrostatic discharge (ESD) protection of other devices typically include an n-buried layer (NBL) together with a N$^+$ sinker diffusion as collectors in each device stripe to provide a low resistance-path to carry ESD strike induced current back to the top surface of the substrate (e.g., a top silicon surface). Due to the large lateral diffusion of the N$^+$ sinker diffusion when forming the N$^+$ sinker using an ion implant followed by a thermal diffusion of the dopant to reach a depth of several μms to provide a low resistance connection to the NBL, the device pitch is thus limited to a large dimension, resulting in the need for significant area on the integrated circuit (IC) die.

SUMMARY

Disclosed embodiments include vertical bipolar transistors that include a sinker diffusion that up-diffuses around a first and second (pair of) trench enclosure which confines the lateral diffusion of the sinker diffusion to provide the collector of the vertical bipolar transistor. Disclosed confining of the lateral diffusion of the sinker diffusion significantly reduces the lateral size of the sinker diffusion and thus the footprint of the transistor.

Another trench enclosure may be added inside the pair of trench enclosures so that for electrostatic discharge (ESD) protection applications the breakdown diode that is triggered by an ESD event is laterally shifted away and thus separated from the vertical bipolar transistor's active region. The addition of the extra trench enclosure enables better control of the ESD induced current as well as forcing the resulting hot spot deeper from the top surface of the substrate, increasing robustness under extreme ESD events such as IEC (e.g. IEC 61000-4-2 standard) pulses.

BRIEF DESCRIPTION OF THE DRAWINGS

Reference will now be made to the accompanying drawings, which are not necessarily drawn to scale, wherein.

DETAILED DESCRIPTION

Figure 1:
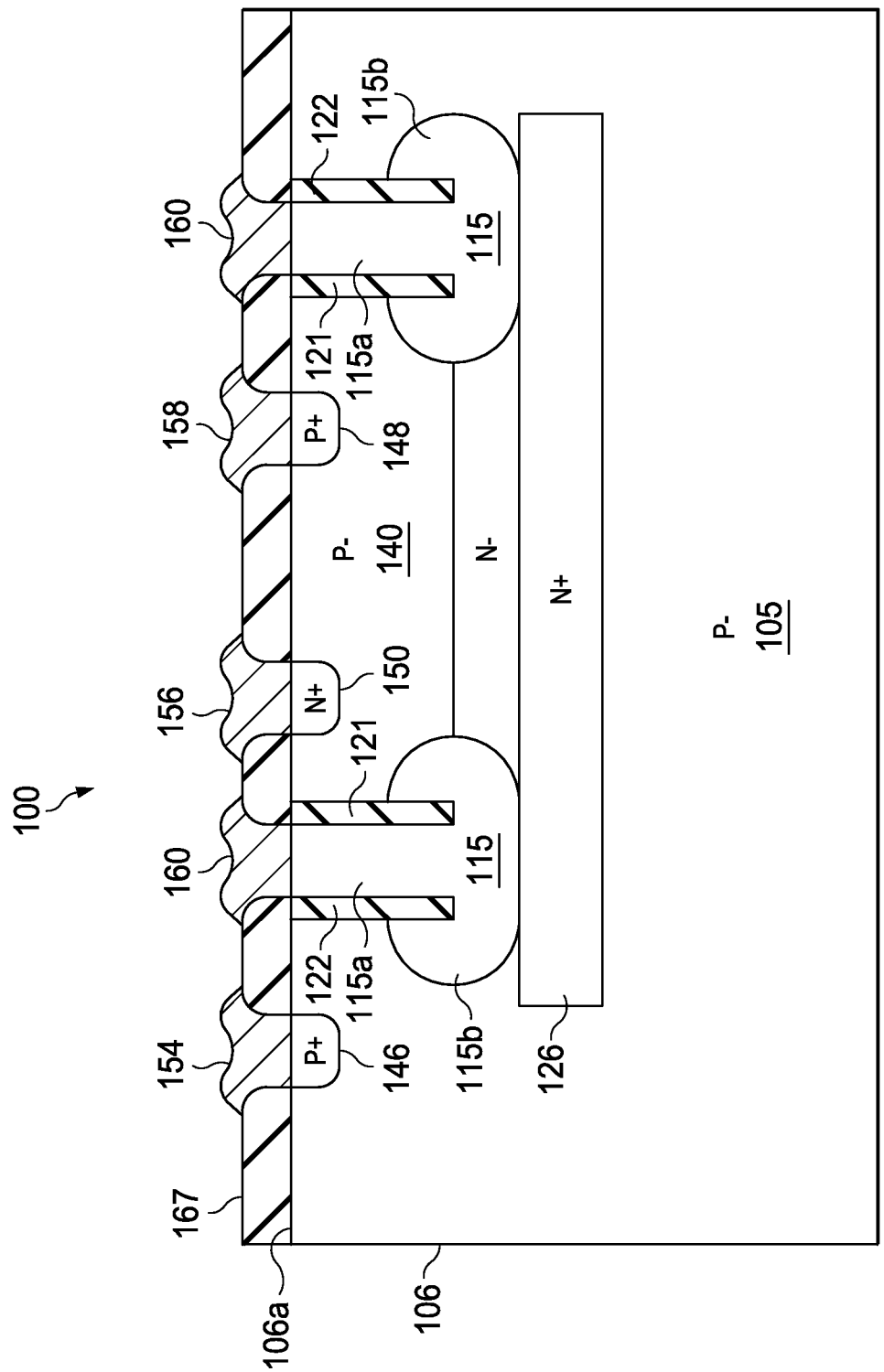
FIG. 1 is a cross sectional view of an example vertical bipolar transistor having a sinker diffusion that up-diffuses around first and second trench enclosures which confine the lateral diffusion of the sinker to build the collector of the vertical bipolar transistor, according to an example embodiment.

Example embodiments are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this disclosure.

FIG. 1 is a cross sectional view of an example vertical bipolar transistor shown as a NPN vertical bipolar transistor 100 having a N+ sinker diffusion 115 that up-diffuses around a first trench enclosure 121 and second trench enclosure 122 which confines the lateral diffusion of the N+ sinker diffusion 115 to build the collector of the vertical bipolar transistor, according to an example embodiment. Although disclosed vertical bipolar transistors are generally described as NPNs, as known in the art reversing the doping types along with some minor design modifications can generally be used to realize PNP bipolars.

Moreover, although generally shown for simplicity as a single bipolar device, for typical practical ESD protection applications an array of disclosed bipolar transistors may be used, as opposed to a single large area bipolar transistor because disclosed collectors lead to a perimeter device since the collector is formed by up-diffusion around a pair of trench enclosures. Therefore, scaling of a single NPN bipolar unit cell generally has limited efficacy, as eventually the resistance of the N+ sinker diffusion 115 or the n-buried layer (NBL) 126 will limit the current handling capability. As a result, an array of unit bipolar cells will generally be advantageous in terms of current handling capability, while exacting a some penalty in terms of area consumed by the N+ sinker diffusion and the trench enclosures.

First trench enclosure 121 and second trench enclosure 122 are at least dielectric lined and extend down from the topside 106a of the semiconductor surface 106 of the substrate shown as a P− substrate 105. The substrate 105 and/or semiconductor surface 106 can comprise silicon, silicon-germanium (SiGe), or other semiconductor material. One particular arrangement is a SiGe semiconductor surface on a silicon substrate. For example, first trench enclosure 121 and second trench enclosure 122 may comprise shallow trench isolation (STI), or other suitable dielectric isolation structures. The first trench enclosure 121 enclosures defines an inner enclosed area. The trench depth for first trench enclosure 121 and second trench enclosure 122 are both typically in the range from 0.5 μm to 8 μm.

The first and second trench enclosures 121 and 122 can be filled with dielectric (e.g., silicon oxide, silicon nitride, or silicon oxynitride), or lined by a dielectric then filled with another material such as polysilicon. An example trench process is forming a pattern and then etching a hole in a hard mask (for example a pad oxide plus silicon nitride or thicker layers if needed), dry etching to cut the trenches, and a thermal liner oxidation to form a first dielectric layer. Deposited oxide can further fill the trenches, and as noted above deposited polysilicon (doped or undoped) can also be used to fill the dielectric lined trenches.

Vertical bipolar transistor 100 includes a base 140 and an emitter 150 formed in the base. Although a single emitter 150 is shown, disclosed bipolar transistors can have a plurality of emitters. Emitter 150 can comprise phosphorous, arsenic or antimony. An NBL 126 is below the trench depth including under the base 140. NBL 126 generally comprises phosphorous, but may also comprise other n-dopants. A contact 158 is shown to the P+ region 148 for contacting the base 140. A contact 154 is shown to P+ region 146 for contacting the semiconductor surface 106 and substrate 105. A contact 156 is shown to emitter 150. A contact 160 is also shown to the topside surface of the N+ sinker diffusion 115. A dielectric layer 167 is lateral to the respective contacts on the topside 106a of the semiconductor surface 106.

The N+ sinker diffusion 115 includes a first portion 115a between the first and second trench enclosures 121 and 122 extending from the topside 106a of the semiconductor surface 106 to the NBL 126 and a second portion 115b within the enclosed area defined by the first trench enclosure 121, wherein the second portion 115b does not extend to the topside 106a of the semiconductor surface 106. The pair of trench enclosures 121 and 122 confine the N+ sinker diffusion 115, causing it to diffuse in a 1 dimensional (1D) fashion which allows it to become deeper for the same thermal cycle as compared to if it were diffusing in 2 dimensions (2D).

Disclosed vertical bipolar transistors such as vertical bipolar transistor 100 shown in FIG. 1 uses current flow through a N+ sinker diffusion (115 in FIG. 1) that is contained between trench enclosures (121 and 122 in FIG. 1) to carry current back to the topside 106a of semiconductor surface 106. As a result of this vertical architecture, the "hot spot" at the base-collector junction is deep within the semiconductor surface 106 or the substrate 105 (e.g., silicon), resulting in a full $4\pi$ steradians of solid angle to diffuse away the heat, resulting in good robustness to high current pulses when used as an ESD protection device. Furthermore, because the N+ sinker diffusion 115 is confined between the trench enclosures 121 and 122, the lateral diffusion of the sinker is minimized and the resulting transistor footprint is compact.

In contrast, known NPN's for ESD protection are built using a conventional trench-less N+ sinker diffusion to-NBL connection as the buried collector. This device design can be problematic because (1) the N+ sinker diffuses laterally for several microns and (2) a significant portion of the ESD induced current flows near the surface, causing a localized failure at low ESD power densities. These two factors combine to make known NPN's for ESD protection very large in area for a given ESD rating.

Figure 2:
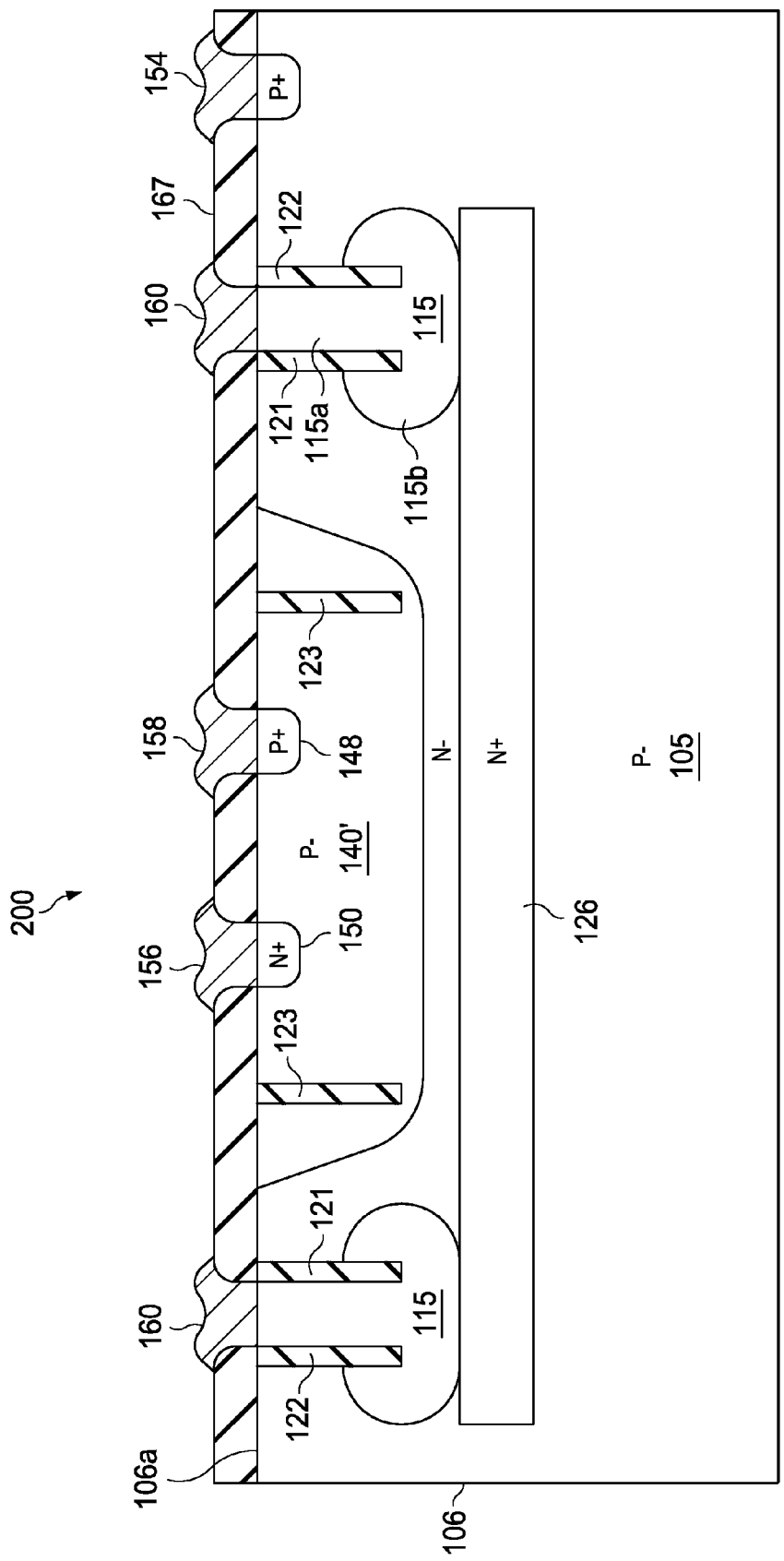
FIG. 2 is a cross sectional view of an example vertical bipolar transistor having a sinker diffusion that up-diffuses around a first and a second trench enclosure which confines the lateral diffusion of the sinker to build the collector of the vertical bipolar transistor, along with a third trench enclosure which forces the breakdown diode triggered by an ESD event to be laterally shifted away (and thus separated) from the vertical bipolar transistor's active region, according to an example embodiment.

FIG. 2 is a cross sectional view of an example vertical bipolar transistor 200 having a disclosed N+ sinker diffusion 115 that up-diffuses around a first and a second trench enclosure 121 and 122 which confines the lateral diffusion of the sinker diffusion 115 to build the collector of the vertical bipolar transistor, along with a third trench enclosure 123 which forces the breakdown diode triggered by an ESD event to be laterally shifted away (and thus separated) from the vertical bipolar transistor's active region, according to an example embodiment. The base shown as 140' in this embodiment extends outside of the third trench enclosure 123. In this embodiment the breakdown is set by the lateral avalanche diode having a junction at the edge of the base 140' between the first trench enclosure 121 and third trench enclosure 123, which in some embodiments is 15 V to 20 V.

The ability to survive an ESD event is one of the key requirements for integrated circuits (ICs). A known method for providing such ESD protection is to include one or more ESD clamping devices that are connected across the external pins of an IC. More generally, the ESD protection or clamping devices are connected between the input terminals of, and thus in parallel with, the circuitry to be protected. These clamping devices are generally designed to breakdown at a voltage below that which would cause damage to the internal circuitry of the IC, thus absorbing the ESD energy and protecting the IC circuitry. Disclosed vertical bipolar transistors can be designed to operate in the bipolar snapback mode to protect the IC circuitry, such as metal oxide semiconductor (MOS) transistors on the IC.

Disclosed vertical bipolar transistors are suitable for a variety of applications including ESD protection, such as for protecting power MOS transistors or power bipolar transistors. In contrast, a typical solution for ESD protection of MOS transistors is to use an NPN vertical bipolar transistor having a conventional trench-less N+ sinker diffusion as the collector sinker. Such a device is large in area due to the N+ sinker's lateral diffusions. The robustness of such known devices as ESD protection devices is also poor due to the shallow depth of the hot spot at failure (see FIG. 4A described below). Another known solution is to use a lateral NPN bipolar, but in this case the hot spot at failure is near the top surface, so that the robustness is also poor. As described above, in contrast, disclosed confining of the lateral diffusion of the sinker diffusion by a pair of trench enclosures significantly reduces the lateral size of a sinker diffusion which enables a compact layout, a deeper hotspot, and improved robustness during ESD strikes (see FIG. 4B described below).

The base doping may be designed with a breakdown voltage in mind to provide ESD protection to target devices. For example, base doping may be added (increased) for disclosed bases such as base 140 for vertical bipolar transistor 100 in FIG. 1 and base 140' for vertical bipolar transistor 200 in FIG. 2 to lower the breakdown voltage of the device. In one embodiment, disclosed bipolar transistors are co-fabricated with MOS transistors, such as with one or more laterally diffused power MOS transistors (e.g., laterally diffused MOS (LDMOS) or double-diffused MOS (DMOS)). In this embodiment a well (DWELL) diffusion including boron used for the body of the LDMOS or DMOS devices can also be used for the base of disclosed vertical bipolar transistors. Adding such a DWELL diffusion to a disclosed vertical bipolar transistor is convenient way to increase the doping level of the more lightly doped base side of the avalanche junction, reducing the breakdown voltage to be around 7 or 8V or less, to be more suitable for protection of a 5V device.

In the LDMOS or DMOS process flow a SNWELL or DNWELL (a deeper, less heavily doped diffusion) can be used around the drain of an NMOS transistor to increase the operating voltage. A SPWELL can be used around the drain of a PMOS transistor similarly. A SPWELL also can be used as the body of an NMOS transistor (DWELL is in the body of the LDMOS so SPWELL would not be used there). SNWELL can be used as the body of a PMOS.

The breakdown diode in a disclosed 20V (or 15V or 25V) NPN bipolar transistor can be set by a lateral SNWELL-SPWELL avalanche diode. The separation between the photomask edges used to delimit the SNWELL and SPWELL implants can be abutted (zero SNWELL-SPWELL separation) to minimize the breakdown voltage, or separated by up to 1 to 2 µm to increase the breakdown voltage. Abutted SNWELL-SPWELL junctions produce an avalanche breakdown voltage of approx 11 v to 15V. The breakdown can be increased by several volts by increasing the SNWELL-SPWELL separation, such as by 1 or 2 µm.

A 5V NPN requires a lower breakdown junction, such as lower than provided by conventional NSD-SPWELL or PSD-SNWELL junctions. The breakdown of these junctions is typically in the range of 7V to 11V. As noted above, given that this range is wide and contains values so far in excess of 5V, using a DWELL to increase the base doping lowers the breakdown voltage by up to a few volts which can be useful for ESD protecting 5V MOS devices.

Figure 3:
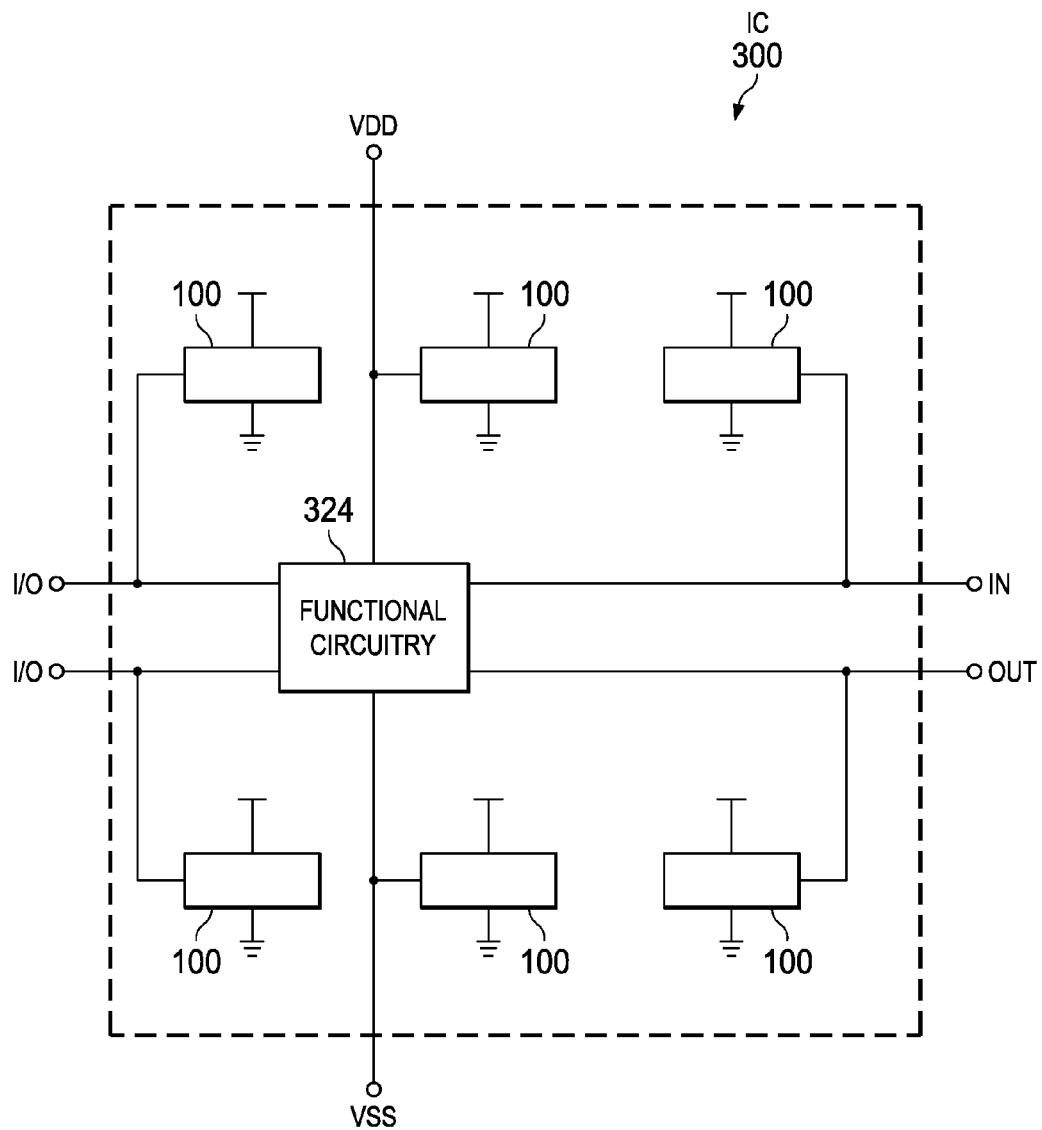
FIG. 3 illustrates a high level depiction of an ESD protected integrated circuit (IC) into which disclosed vertical bipolar transistors may be incorporated to protect one or more terminals of the IC, according to an example embodiment.

FIG. 3 illustrates a high level depiction of an ESD protected IC into which disclosed vertical bipolar transistors shown as vertical bipolar transistor 100 may be incorporated to protect one or more terminals of the IC, according to an example embodiment. The "T" indicated at the top of the respective ESD protection devices 100 in FIG. 3 represents an input from a suitable trigger circuit.

IC 300 is shown including functional circuitry 324 which can include complementary metal-oxide-semiconductor (CMOS) functional circuitry and/or bipolar functional circuitry, which is circuitry that realizes and carries out desired functionality of IC 300, such as that of a digital IC (e.g., digital signal processor) or analog IC (e.g., amplifier or power converter). The capability of functional circuitry 324 provided by IC 300 may vary, for example ranging from a simple device to a complex device. The specific functionality contained within functional circuitry 324 is not of importance to disclosed embodiments.

IC 300 also includes a number of external terminals, by way of which functional circuitry 324 carries out its function. A few of those external terminals are illustrated in FIG. 3. It is to be understood that the number of terminals and their function can also vary widely. In the example of IC 300 shown in FIG. 3, two terminals shown operate as common input and output terminals (I/O), by way of which functional circuitry 324 can receive incoming signals and can generate outputs, as well known in the art. A dedicated input terminal IN is also shown in FIG. 3 for IC, as is a dedicated output terminal OUT. Each of terminals IN, OUT are also connected to functional circuitry 324. Power supply terminal Vdd receives a positive power supply voltage in this example, while ground terminal Vss is provided to receive a reference voltage, such as system ground. Although not shown, the ground shown connected to the ESD protection devices 100 is coupled to VSS, such as resistively coupled or shorted together.

IC 300 includes an instance of a disclosed vertical bipolar transistor 100 connected to each of its terminals. Each vertical bipolar transistor 100 is connected to its corresponding terminal in parallel with the functional circuitry 324. Vertical bipolar transistors 100 are also connected to power supply and reference voltage terminals VDD, VSS, in parallel with functional circuitry 324. However, in some applications, some pins of the device being protected will be self-protecting, such as diode protected power supply pins. Pins also can be protected against different levels of ESD strike (Human Body Model (HBM), Charged Device Model (CDM), IEC, etc.).

Figure 4A:
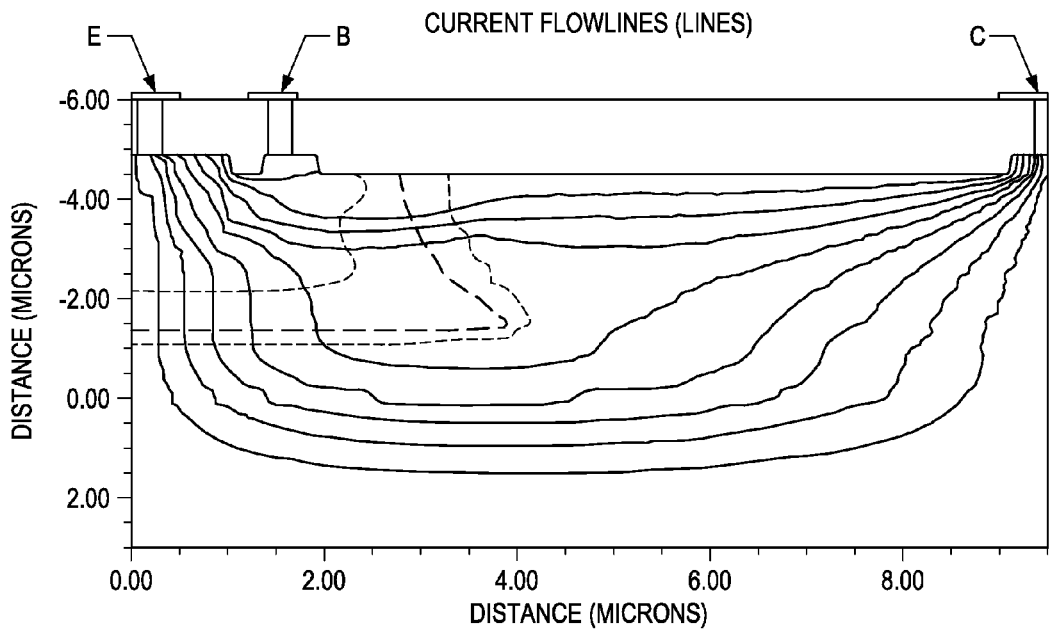
FIG. 4A depicts the current flow from emitter (E) to collector (C) for a NPN vertical bipolar transistor having a conventional trench-less N+ sinker diffusion as the collector upon receiving a simulated ESD strike with the lines shown depicting the ESD induced current flow.

Disclosed embodiments are further illustrated by the following specific Examples, which should not be construed as limiting the scope or content of this Disclosure in any way. FIG. 4A depicts the current flow from emitter (E) to collector (C) for a NPN vertical bipolar transistor having a conventional trench-less N+ sinker diffusion as the collector upon receiving a simulated ESD strike with the lines shown depicting the ESD induced current flow. The lines of current near the top surface of the transistor evidence a lack of robustness upon an ESD strike due to the shallow depth of the resulting ESD induced hot spot failure.

Figure 4B:
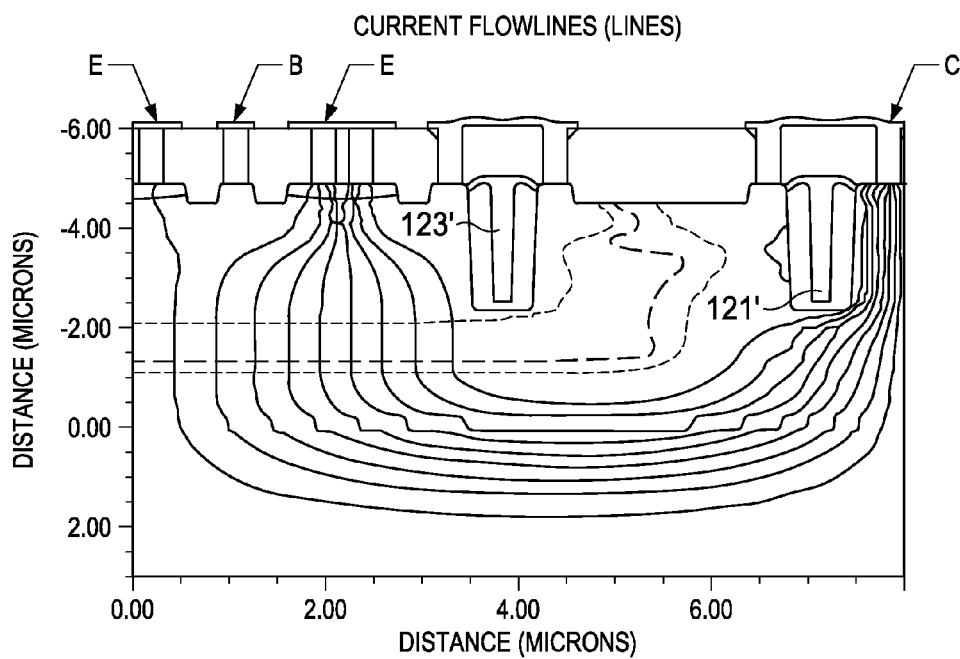
FIG. 4B depicts the current flow from emitter (E) to collector (C) for the NPN vertical bipolar transistor shown in FIG. 2 having a disclosed sinker diffusion that up-diffuses around a first and a second trench enclosure which confines the lateral diffusion of the sinker diffusion to provide the collector of the vertical bipolar transistor, along with a third trench enclosure.

FIG. 4B depicts the current flow from emitter (E) to collector (C) for the NPN vertical bipolar transistor 200 shown in FIG. 2 having a disclosed sinker diffusion that up-diffuses around a first and a second trench enclosure which confines the lateral diffusion of the sinker diffusion to provide the collector of the vertical bipolar transistor 200, along with a third trench enclosure. The lines of current shown evidence no lines of ESD induced current near the top surface, with the lines of current shown evidencing the breakdown diode triggered by the simulated ESD event also being laterally shifted away (and thus separated) from the vertical bipolar transistor's active region. As described above, in this embodiment the device breakdown is set by the lateral avalanche diode having a junction at the edge of the base (140' in FIG. 2) between the first trench enclosure (shown in FIG. 4B as 121' to represent a polysilicon-filled version of first trench enclosure 121 shown in FIG. 2) and third trench enclosure (shown as 123' to represent a polysilicon-filled version of the third trench enclosure 123 herein shown in FIG. 2).

Disclosed embodiments can be used to form semiconductor die that may integrated into a variety of assembly flows to form a variety of different devices and related products. The semiconductor die may include various elements therein and/or layers thereon, including barrier layers, dielectric layers, device structures, active elements and passive elements including source regions, drain regions, bit lines, bases, emitters, collectors, conductive lines, conductive vias, etc. Moreover, the semiconductor die can be formed from a variety of processes including bipolar, CMOS, BiCMOS and MEMS.

Those skilled in the art to which this disclosure relates will appreciate that many other embodiments and variations of embodiments are possible within the scope of the claimed invention, and further additions, deletions, substitutions and modifications may be made to the described embodiments without departing from the scope of this disclosure.

The invention claimed is:

1. A bipolar transistor, comprising:
    a substrate having a semiconductor surface;
    a first trench enclosure and a second trench enclosure outside said first trench enclosure both at least lined with a dielectric extending downward from a topside of said semiconductor surface to a trench depth, said first trench enclosure defining an inner enclosed area;
    a base and an emitter formed in said base within said inner enclosed area;
    a buried layer below said trench depth including under said base, and a sinker diffusion including a first portion between said first and said second trench enclosures extending from said topside of said semiconductor surface to said buried layer and a second portion within said inner enclosed area, wherein said second portion does not extend to said topside of said semiconductor surface.

2. The bipolar transistor of claim 1, wherein said bipolar transistor is an NPN transistor.

3. The bipolar transistor of claim 1, further comprising a third trench enclosure inside the first trench enclosure.

4. The bipolar transistor of claim 1, wherein said semiconductor surface comprises silicon.

5. The bipolar transistor of claim 1, wherein said sinker diffusion comprises phosphorous.

6. The bipolar transistor of claim 1, wherein said semiconductor surface comprises silicon/germanium and said substrate comprises silicon.

7. An integrated circuit (IC), comprising:
- a substrate having a semiconductor surface;
- functional circuitry formed using said semiconductor surface configured to realize and carry out a functionality having a plurality of terminals including at least a first terminal and a ground terminal;
- at least one bipolar transistor configured as an electrostatic discharge (ESD) protection device for said IC formed in said semiconductor surface, said bipolar transistor comprising:
  - a first trench enclosure and a second trench enclosure outside the first trench enclosure both at least lined with a dielectric extending downward from a topside of said semiconductor surface to a trench depth, said first trench enclosure defining an inner enclosed area;
  - a base and an emitter formed in said base within said inner enclosed area;
  - a buried layer below said trench depth including under said base, and
  - a sinker diffusion including a first portion between said first and said second trench enclosures extending from said topside of said semiconductor surface to said buried layer and a second portion within said inner enclosed area, wherein said second portion does not extend to said topside of said semiconductor surface.

8. The IC of claim 7, wherein said bipolar transistor is an NPN transistor.

9. The IC of claim 7, further comprising a third trench enclosure inside the first trench enclosure.

10. The IC of claim 7, wherein said semiconductor surface comprises silicon.

11. The IC of claim 7, wherein said sinker diffusion comprises phosphorous.

12. The IC of claim 7, wherein said semiconductor surface comprises silicon/germanium and said substrate comprises silicon.

* * * * *